(12) United States Patent
Singh et al.

(10) Patent No.: US 7,515,076 B1
(45) Date of Patent: Apr. 7, 2009

(54) METHOD AND APPARATUS FOR REDUCING SWITCHING NOISE IN A SYSTEM-ON-CHIP (SOC) INTEGRATED CIRCUIT INCLUDING AN ANALOG-TO-DIGITAL CONVERTER (ADC)

(75) Inventors: Rahul Singh, Austin, TX (US); Prashanth Drakshapalli, Austin, TX (US); Jie Fang, Austin, TX (US); Edwin De Angel, Austin, TX (US); Mohit Sood, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/864,876

(22) Filed: Sep. 28, 2007

(51) Int. Cl.
*H03M 1/00* (2006.01)
(52) U.S. Cl. .................. 341/122; 341/123; 341/155
(58) Field of Classification Search ............ 341/122, 341/123, 155
See application file for complete search history.

(56) References Cited

U.S. PATENT DOCUMENTS

| | | | |
|---|---|---|---|
| 4,746,899 A * | 5/1988 | Swanson et al. | 341/122 |
| 6,091,349 A | 7/2000 | Chadha et al. | |
| 6,300,889 B1 * | 10/2001 | Piasecki | 341/122 |
| 6,377,198 B1 * | 4/2002 | Johnston et al. | 341/143 |
| 6,950,044 B1 | 9/2005 | Piaseki et al. | |
| 6,963,626 B1 * | 11/2005 | Shaeffer et al. | 375/346 |
| 7,190,197 B1 | 3/2007 | You et al. | |
| 7,209,061 B2 * | 4/2007 | Somayajula | 341/122 |
| 7,382,300 B1 * | 6/2008 | Nanda et al. | 341/143 |

OTHER PUBLICATIONS

U.S. Appl. No. 11/564,331, filed Nov. 29, 2006, Nanda, et al.

* cited by examiner

*Primary Examiner*—Khai M Nguyen
(74) *Attorney, Agent, or Firm*—Andrew M. Harris; Mitch Harris, Atty at Law, LLC

(57) ABSTRACT

A method and apparatus for reducing switching noise in a system-on-chip (SoC) integrated circuit including an analog to digital converter (ADC) provides for reduced noise in the ADC conversions. Sampling circuits of the ADC are operated by sampling clock signals and digital circuits and other noise-generating circuits such as power converters, are operated by digital circuit clock signals. Both sets of clock signals are derived from the same master clock by a clock generator circuit, but an offset is applied in the clock generator circuit to move the edges of the digital circuit clock signals away from critical sampling intervals corresponding to edges of the sampling clocks. In one embodiment, the offset is applied by a processor core that forms part of the digital circuits by setting a value in the clock generator, which the clock generator then loads into the divider after halting the clock to the digital circuits.

18 Claims, 6 Drawing Sheets

METHOD AND APPARATUS FOR REDUCING SWITCHING NOISE IN A SYSTEM-ON-CHIP (SOC) INTEGRATED CIRCUIT INCLUDING AN ANALOG-TO-DIGITAL CONVERTER (ADC)

BACKGROUND OF THE INVENTION

1. Field of the Invention

The present invention relates generally to analog-to-digital converters, and more specifically, to an on-chip system including an analog-to-digital converter (ADC) that is operated by a clock signal derived from the same master clock that operates digital circuits.

2. Background of the Invention

System-on-Chip (SoC) integrated circuits are ubiquitous in embedded applications such as household devices, personal computers and industrial electronics. SoCs reduce the cost of systems and increase their performance by reducing the parts count and decreasing the number of interconnects required to implement a given device. SoCs frequently include analog conversion components such as ADCs and digital-to-analog converters (DACs) in order to provide a system interface to analog signals, perform analog measurements and to provide analog outputs.

In an SoC design, the ADC typically coexists with a large amount of digital logic, which typically implements a processor core or a dedicated signal processing circuit. Such circuits generate a large amount of switching noise on power supply rails of the integrated circuit, as well as generating noise on signal lines within the ADC portion of the integrated circuit that affect the converter output values. Further, the SoC may include power converters such as charge pump circuits that switch large currents, increasing the amount of noise in the ADC measurements. The noise level at the ADC input affects the useful resolution of the converter and is typically manageable only by adjusting the circuit layout and "managing" the timing of the digital switching signals so that all of the transitions occur over a small portion of the ADC conversion cycle. The highest frequency digital circuit clocks are typically the signals that are managed, as those clocks are responsible for the majority of the noise generated in the analog circuits.

However, digital circuits such as processors, which are affected by program flow as well as clock state, cannot be managed in the manner described above, as logic transitions can and will occur at any point in the ADC conversion cycle. Further, when a processor core instruction rate is much higher than the converter sample rate, the various phases of instruction processing will lie throughout the conversion cycle and cannot be held to just a small window without affecting performance of the core.

Therefore, it would be desirable to provide an SoC including an ADC that can be operated in a manner that reduces or eliminates the noise generated during analog signal conversions by a processor core or other digital circuit as well as power conversion circuits.

SUMMARY OF THE INVENTION

The above stated objective of reducing or eliminating the switching noise generated in SoC-integrated ADCs by other digital circuits, such as processor cores and power converter circuits, is realized in an SoC integrated circuit including a discrete-time sampling analog-to-digital converter circuit, and a method of operation.

The SoC integrated circuit includes a sampling ADC circuit for sampling an analog input signal and providing digital output stream from a digital output and digital logic such as digital filters and a processor core. A clock generator circuit generates ADC clock signals that control the sampling in the ADC circuit and digital block clock signals that control the switching of the digital logic. The clock signals are generated from a common master clock. During initialization of the SoC integrated circuit, the clock generator circuit adjusts the edge positions of the digital clock signals with respect to the ADC clock signals so that edges of the digital clock signals fall outside critical sampling intervals corresponding to edges of the ADC clock signals, reducing or eliminating the ADC noise produced due to switching currents in the digital logic.

The SoC integrated circuit may include a power converter circuit, and the control logic can prevent the power converter circuit from switching during the sampling intervals of the sampling ADC, either by generating a blocking signal that prevents the switching during the sampling intervals, or by adjusting a timing of the power converter switching clock.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for reducing or eliminating switching noise generated by digital circuits in a system-on-chip (SoC) in analog values sampled by a analog-to-digital converter (ADC) integrated within the SoC integrated circuit. The edges of the clock signals that cause switching transitions in the digital logic are synchronized with, and offset from, the critical sampling edges of the sampling circuits ADC, by generating the clock signals from a common master clock. The offset is introduced during initialization to enforce an offset relationship between the switching edges and the critical sampling edges with sufficient margin to ensure that parasitically-coupled and power supply-coupled noise due to the digital switching is not captured by the sampling circuits. A power converter may be likewise synchronized from the common master clock, so that the switching of the power converter current is performed during periods substantially displaced from the critical sampling edges of the sampling circuits.

The critical sampling edges of the ADC are those edges at the end of the charge transfers from the ADC input, from any applied reference/feedback voltage and the end of the charge transfer onto the integrator. At the critical sampling edge, the low impedance sources that provide the charging voltage during the sampling interval are disconnected, and any voltage due to transients on the power supply or from parasitic capacitive coupling that are present during the disconnection edge transition are undesirably "captured" on the corresponding capacitor. Therefore, if the transients can be prevented from occurring at or near the critical sampling edges, the above-described problem can be prevented.

Figure 1:
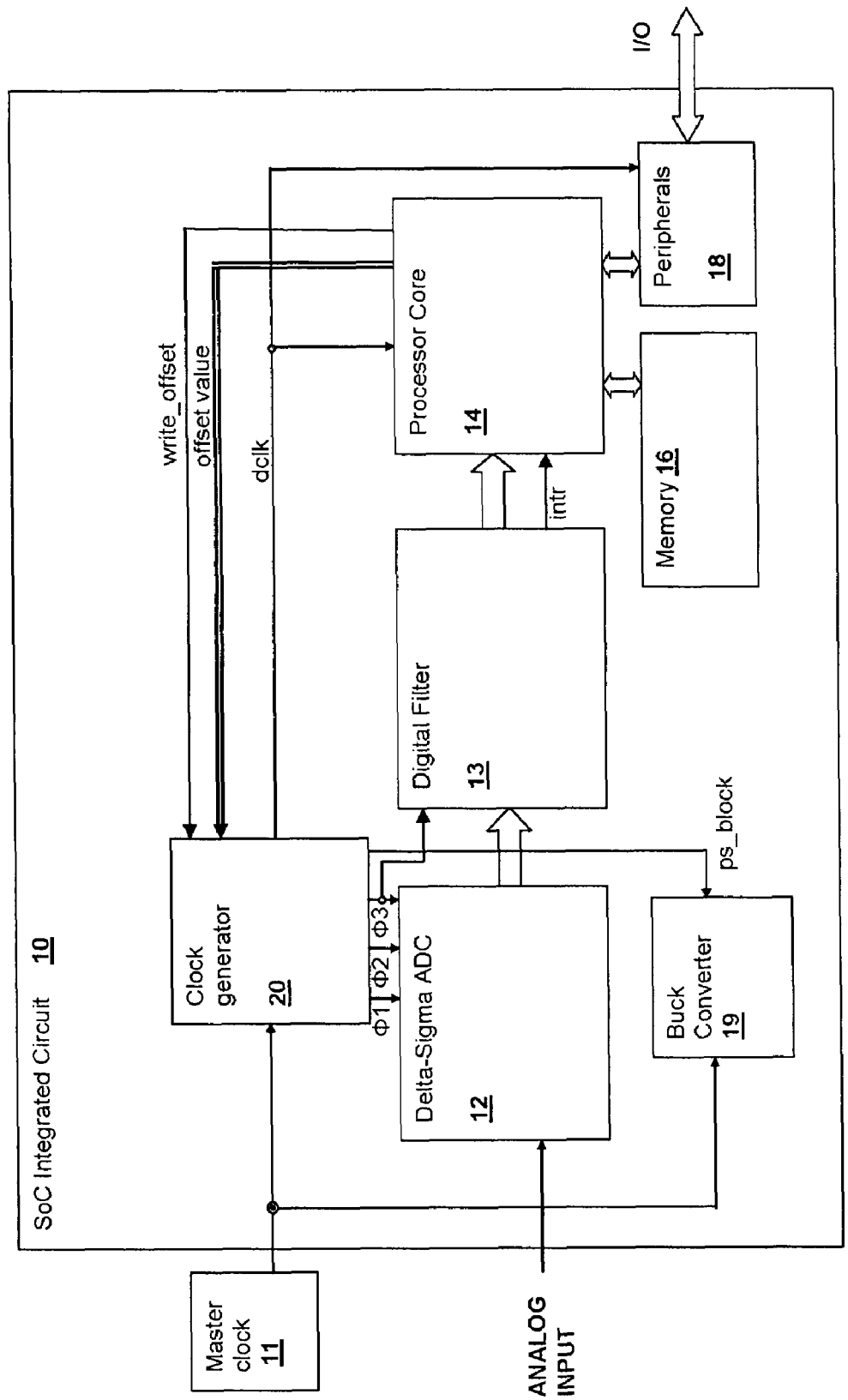
FIG. 1 is a block diagram depicting an SoC integrated circuit in accordance with an embodiment of the present invention.

Referring now to FIG. 1, an SoC integrated circuit 10 in accordance with an embodiment of the present invention is shown. SoC integrated circuit 10 includes a delta-sigma ADC 12 having one or more input(s) ANALOG INPUT. Delta-sigma ADC 12 provides quantized output samples to a digital filter 13. A processor core 14 receives the output of digital filter 13 in response to an interrupt signal intr and performs further operations on the output of digital filter 13 that are directed by program instructions stored in a memory 16. Such operations may include, for example, signal processing operations, data manipulation, control of peripherals 18, and transmission of resultant values to other devices. For example, peripherals 18 may include an interface controller coupled to processor core 14 for communication between SoC integrated circuit 10 and external circuits, so that communication of values derived or received from digital filter 13 and/or control of external devices coupled to peripherals 18 can be made in conformity with measurements of signals provided at input ANALOG INPUT.

The depicted SoC integrated circuit 10 is only one example of an integrated circuit to which techniques of the invention may be applied. Other integrated circuits having significant digital elements and consequent generated noise will also benefit from application of the techniques of the present invention. For example, processor core 14, memory 16 and peripherals 18 may be replaced in another embodiment by a dedicated digital logic circuit connected by a bus interface to external devices. In yet another embodiment, second digital filter 13 may be the only digital circuit for which generated noise is being eliminated from the ADC measurements, and digital filter 13 may be coupled directly via an interface to devices external to the integrated circuit.

SoC integrated circuit 10 is illustrated as receiving a master clock signal from master clock 11, which is provided to a clock generator 20 that generates clock signals for both analog and digital circuits of SoC integrated circuit 10. Clock generator 20 generates a digital clock signal dclk provided to processor core 14 and peripherals 18 and provides analog clock phase signals Φ1, Φ2 and Φ3 that control discrete time switching circuits within delta-sigma ADC 12. Analog clock phase signal Φ3 also clocks the delta-sigma ADC 12 output values into digital filter 13. Master clock 11 is also provided to an internal buck converter 19, which provides analog and digital power supply voltages to analog and digital circuits of SoC integrated circuit 10. While the illustrative embodiment of SoC integrated circuit 10 shows only a single digital clock signal dclk, in general, clock generator 20 will generate multiple digital clock signals provided to various digital circuits. Further, while buck converter 19 is operated from master clock 11 directly in the depicted embodiment, it is understood that clock generator 20 may generate clock signals that operate power converters at a lower frequency than master clock 11. In such implementations, the power converter signals may also have an offset controlled by offset value offset value. Also, while master clock 11 is shown as an external clock signal/oscillator output provided to SoC integrated circuit 10, master clock 11 may be an oscillator such as an RC oscillator completely internal to SoC integrated circuit 10, or an oscillator using an external crystal or resonator.

Clock generator 20 provides operations that ensure that transitions of digital clock signal dclk and switching of buck converter 19 occur away from critical sampling edges of analog clock phase signals Φ1 and Φ2. (Clock phase signal Φ3 is an optional special-purpose clock phase having no critical edge as will be described in detail below.) Clock generator 20 enforces the above-described conditions by generating a power supply switch blocking signal ps_block and by controlling the timing of digital clock signal dclk with respect to analog clock phase signals Φ1 and Φ2 via an initialization mechanism that will be described in further detail below. If buck converter 19 must remain operating when digital clock signal dclk is halted, then a separate divider chain may be employed to operate buck converter 19. If operation buck converter 19 can be temporarily halted, the digital clock signal dclk, or another signal derived from the same divider chain as digital clock signal dclk, may be used to operate buck converter 19.

At the end of each ADC sampling period, a pulse is generated on signal adc_sync and provided to digital filter 13 to process the quantized sample, as well as to processor core 14, which reads the output of digital filter 13, when the correct number of samples have been processed to provide an ADC measurement value. Processor core 14 provides an offset value offset value to clock generator 20, which is synchronously loaded into a divider chain within clock generator 20 that provides digital clock signal dclk, so that a timing offset between the critical sampling edges of analog clock phase signals Φ1 and Φ2 is programmed. A write strobe signal write_offset is provided from processor core 14 to clock generator 20 to load offset value offset value into the internal divider chain that provides digital clock signal dclk. In response to writing the offset value, processor core 14 is stopped by halting digital clock signal dclk. Clock generator 20 resumes generation of digital clock signal dclk at the beginning of another cycle of analog clock phase signals Φ1, Φ2 and Φ3, with a newly established delay of the edges of digital clock signal dclk as established by the programmed offset value.

Figure 2:
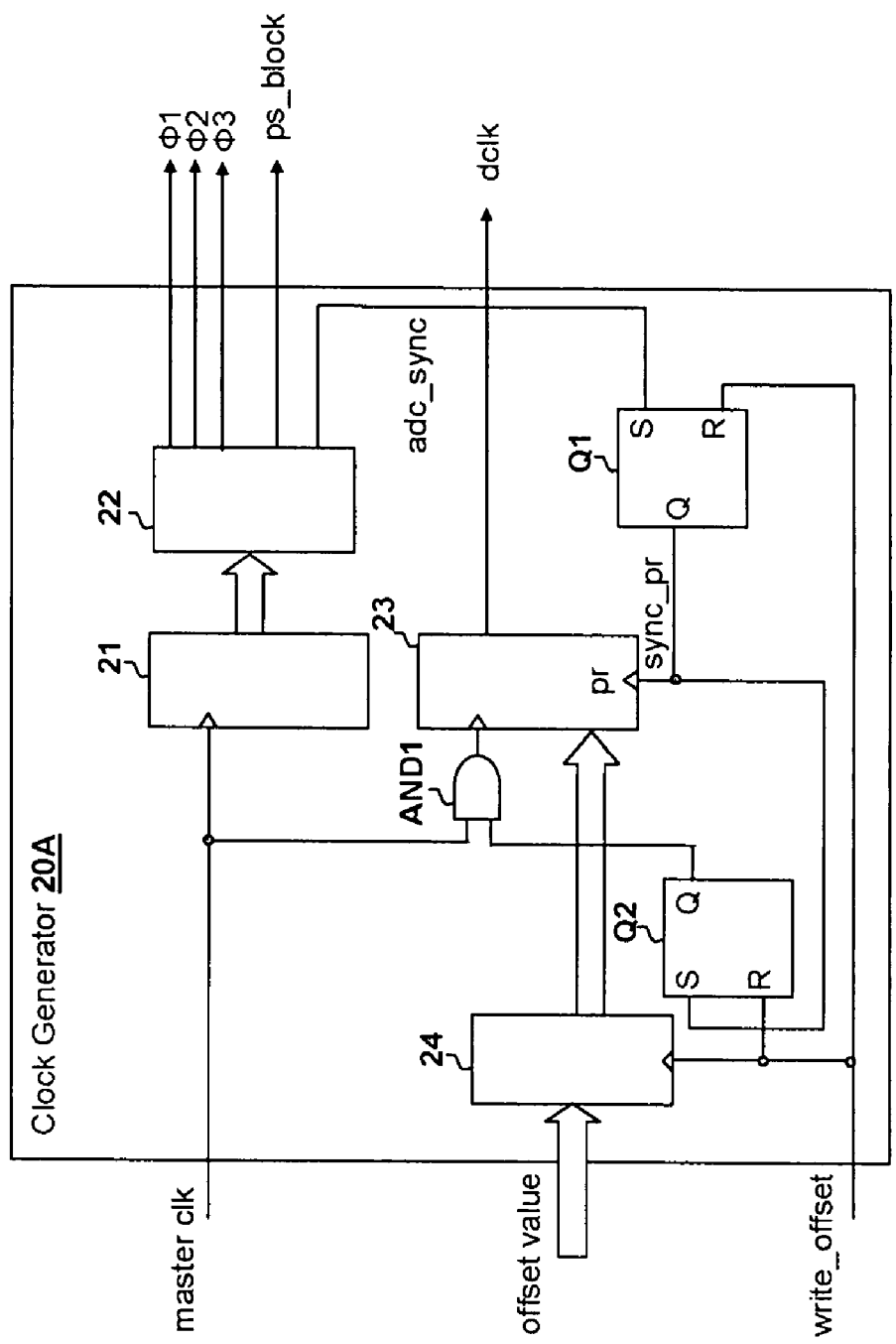
FIG. 2 is a block diagram depicting details of a clock generator 20A in accordance with an embodiment of the present invention that may be used to implement clock generator 20 of FIG. 1.

Referring now to FIG. 2, a clock generator circuit 20A is shown in accordance with an embodiment of the present invention, which can be used to implement clock generator 20 of FIG. 1. Analog clock phase signals Φ1, Φ2 and Φ3, as well as power supply blocking signal ps_block and ADC sync signal adc_sync are generated by a divider chain 21 and combinatorial logic 22 that generate the proper widths for clock phase signals Φ1, Φ2 and Φ3 and power supply blocking signal ps_block according to divisions of a master clock signal master clk. Another divider chain 23 generates digital clock signal dclk. Divider chain 23 has a preset value input provided from a register 24, which is written with a value offset value provided by processor core 14 when a write strobe write_offset is asserted.

Initialization logic, including flip-flops Q1, Q2 and logical-AND gate AND1, provides control of the initialization of divider chain 23, according to the following sequence. Processor core 14 writes value offset value into register 24 and is halted by the re-setting of flip-flop Q2 which stops the clock to divider 23 and thus halts digital clock signal dclk. Flip-flop Q1 is also reset in response to writing of value offset value into register 24 and remains reset until a next occurrence of sync signal adc_sync sets flip-flop Q1. Value offset value is loaded into divider chain 23 on the positive transition of signal sync_pr which is generated by flip-flop Q1, causing the edges of digital clock signal dclk (and any other clock signal generated by divider chain 23) to be shifted away from the edges of signals generated by divider chain 21, including clock phase signals Φ1, Φ2 and Φ3. Since flip-flop Q1 will remain set until a new value offset value is written, digital clock signal dclk is generated continuously unless another value offset value is written, and value offset value is only loaded into divider chain 23 once. Value offset value is a binary count value that is pre-set into divider chain 23 to reposition the edges of signals, including the edges of digital clock signal dclk, with respect wrap-around count of divider chain 23. The ratios between the analog section clock signals and digital clock signals are chosen, and value offset value is also chosen, such that all clocks generated from divider chain 23 will remain aligned with the critical sampling edges of the analog section clock signals, so that the offset introduced by value offset value will keep the digital signal transitions away from the critical sampling edges of ADC 12 for all sampling periods after the offset has been introduced in divider chain 23.

Figure 3:
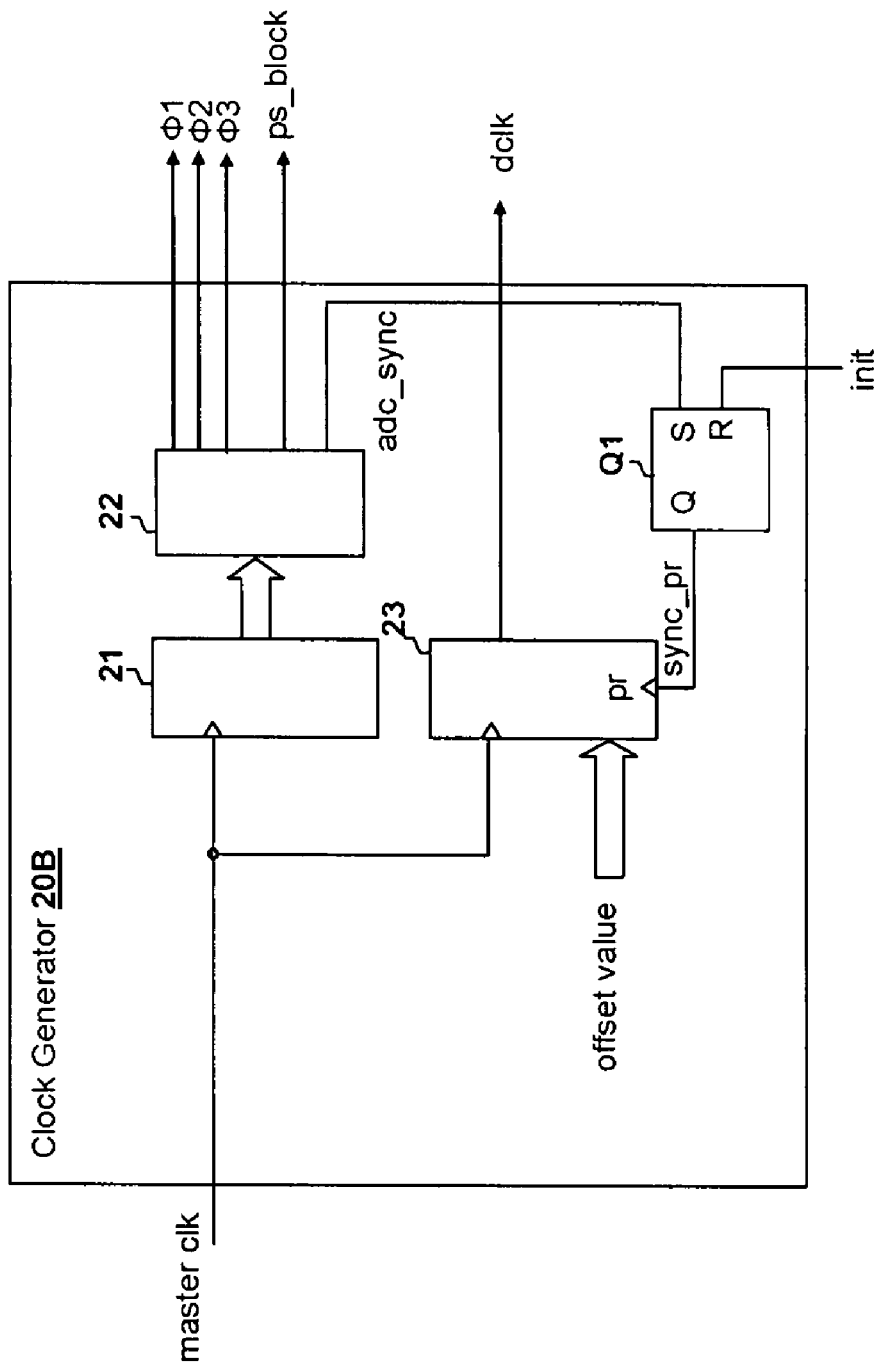
FIG. 3 is a block diagram depicting details of a clock generator 20B in accordance with another embodiment of the present invention that may be used to implement clock generator 20 of FIG. 1.

Referring now to FIG. 3, a clock generator circuit 20B in accordance with another embodiment of the present invention is shown, that can be alternatively used to implement clock generator 20 of FIG. 1. Clock generator 20B is similar to clock generator 20A of FIG. 2, so only differences between them and their operation will be described below. Clock generator 20B is representative of a logic implementation that does not require intervention of a processor, and is suitable for implementations in which processor core 14 is absent. After an initialization signal init has been released, offset value offset value is loaded into divider chain 23 on a next occurrence of signal adc_sync. Offset value offset value may be a predetermined (hardwired) value, or alternatively an offset value may be provided by a register such as a programmable register accessible external to SoC integrated circuit 10 via an interface. Flip-flop Q1 asserts signal sync_pr in response to the next assertion of signal adc_sync, causing value offset value to be loaded into divider chain 23.

Figure 4A:
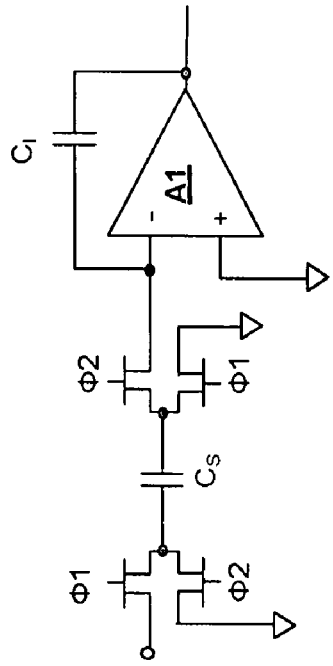
FIGS. 4A-4C are circuit diagrams of integrator stages that may be employed in an ADC of an SoC in accordance with an embodiment of the present invention.
Figure 4B:
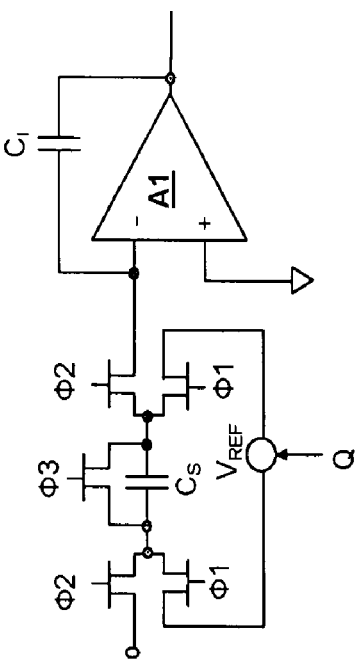
Figure 4C:
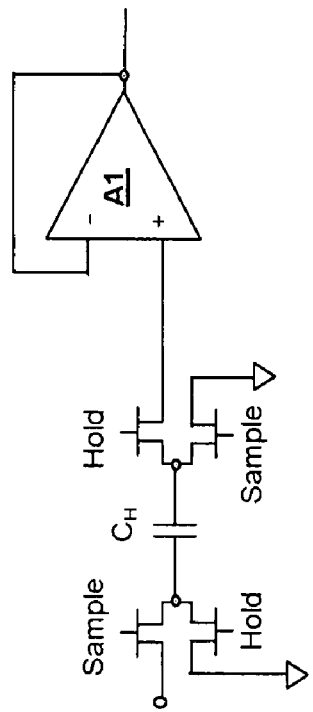

Referring now to FIGS. 4A-4C, various ADC sampling input stages are shown that illustrate the relationship of critical sampling edges to the sampling circuit elements. FIG. 4A shows a three-phase sampling circuit. Clock phase signal Φ1 causes a quantizer-dependent reference charge $V_{REF}$ to be applied on sampling capacitor $C_S$. During the initial edge of clock phase signal Φ1 and during most of the period in which clock phase signal Φ1 is asserted, transient noise has little effect on the reference charge subsequently transferred from sampling capacitor $C_S$, since capacitor $C_S$ is coupled to reference voltage source $V_{REF}$. However, just before and during the trailing edge of clock phase signal Φ1, any transient voltage present on capacitor $C_S$ will alter the reference charge held on capacitor $C_S$ that is applied to the integrator formed by amplifier A1 and capacitor $C_I$ during the next sampling clock phase. Therefore, the trailing edge of clock phase signal Φ1 is a critical edge.

When clock phase signal Φ2 is asserted, the reference charge held on capacitor $C_S$ is applied in series with the input voltage resulting in a change in the output of amplifier A1 that maintains the summing nodes of amplifier A1 at ground. During the initial edge of clock phase signal Φ2 and during most of the period in which clock phase signal Φ2 is asserted, transient noise has little effect on the final value of charge transferred to integrator capacitor $C_I$, since capacitor $C_I$ is coupled to the output of amplifier A1, capacitor $C_S$ is coupled to the input. Any actual induced change will be canceled by further charge transfer between capacitors $C_S$ and $C_I$ to represent the correct reference voltage/input voltage relationship. However, just before and during the trailing edge of clock phase signal Φ2, any transient voltage change caused on capacitor $C_I$ will be retained. Therefore, the trailing edge of clock phase signal Φ2 is also a critical edge. Clock phase signal Φ3 is provided to discharge capacitor $C_S$ to remove signal-dependent charge that can introduce harmonics on the reference voltage source $V_{REF}$, but the charge on capacitor $C_S$ is subsequently set during the next clock phase initiated by clock phase signal Φ1, and therefore there are no critical edges of clock phase signal Φ3.

FIG. 4B illustrates a typical switched-capacitor sampling ADC input stage. The reference capacitor and switches have been omitted for clarity. When clock phase signal Φ1 is asserted, the input signal is sampled directly and when clock phase signal phase signal Φ2 is asserted, the charge on capacitor $C_S$ is transferred to capacitor $C_I$. Therefore, similar to the above description of the circuit of FIG. 4A, the critical sampling edges of the circuit of FIG. 4B will also fall at the trailing edges of clock phase signals Φ1 and Φ2.

FIG. 4C illustrates a typical sample/hold circuit for an ADC input stage as may be employed in ADC converters other than delta-sigma ADCs. Hold capacitor $C_H$ holds whatever value was present at the end of the Sample signal, and therefore the trailing edge of the Sample signal is a critical sampling edge. The leading edge of the Hold signal is similarly critical and generally corresponds directly to the trailing edge of the Sample signal. While sample/hold circuits are generally operated at a slower rate than discrete-time sampling circuits in a delta-sigma modulator ADC, and therefore provide more flexibility for timing their operation with respect to digital circuits, the techniques of the present invention may be applied to sample/hold circuits and to types of ADC circuits other than delta-sigma modulator based ADCs.

Figure 5:
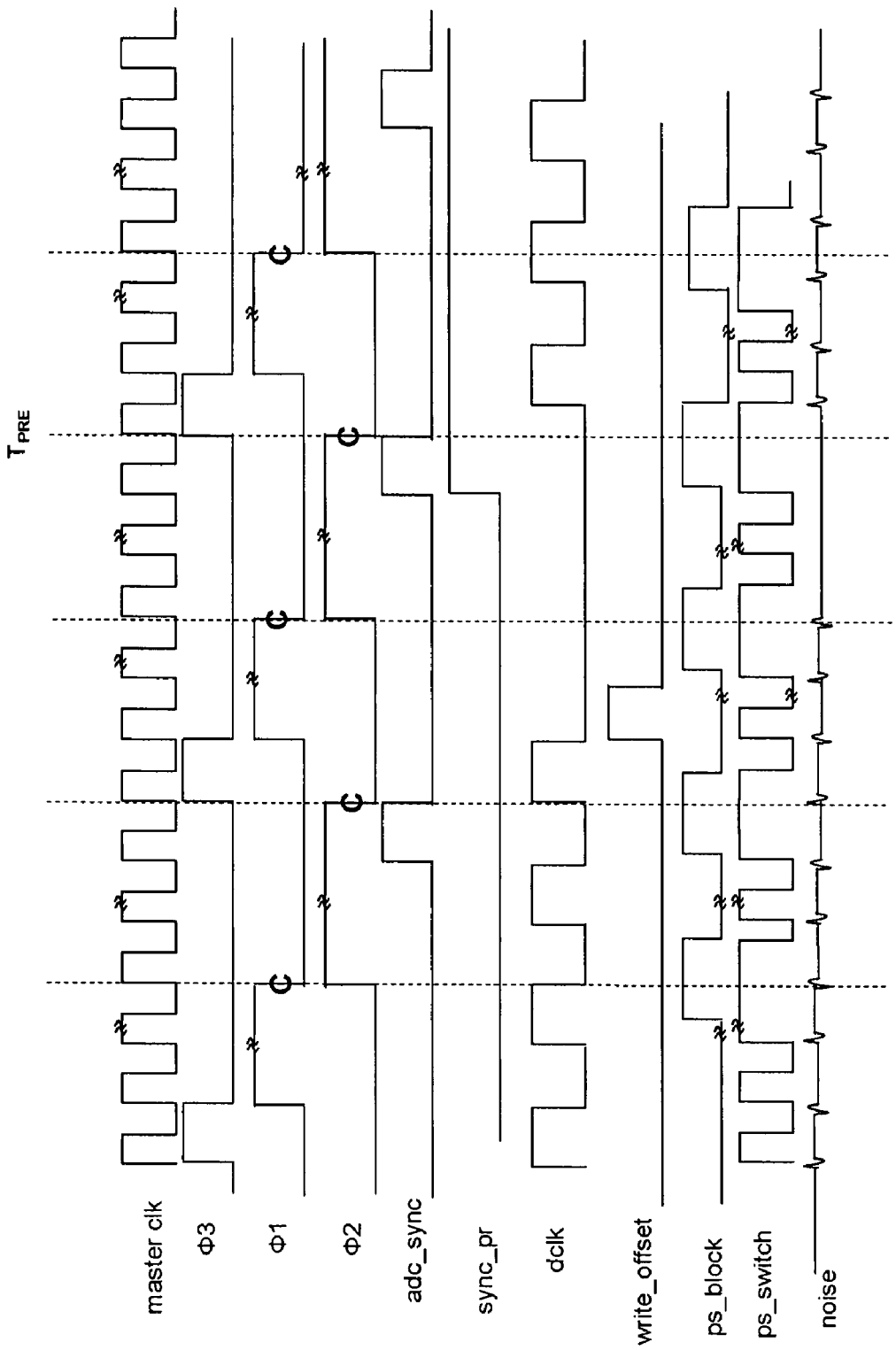
FIG. 5 is a signal timing diagram depicting signal relationships within the circuit of FIG. 1.

Referring now to FIG. 5, an exemplary diagram of signals within SoC integrated circuit 10 of FIG. 1 is shown. The signals are shown in time and voltage relationship with each other, to further demonstrate the operation of the present invention. Master clock signal master clk is divided and decoded to produce sampling clock phase signals Φ1, Φ2 and Φ3, ADC sync signal adc_sync and power supply blocking signal ps_block by divider chain 21 and combinatorial logic block 22. Critical edges of sampling clock phase signals Φ1, Φ2 are marked as "C". Prior to time $T_{PRE}$, the critical edges of sampling clock phase signals Φ1, Φ2 are aligned with the edges of digital clock signal dclk and with the rising edges of master clock signal master_clk, which operates buck converter 19. Signal noise represents transients generated by the digital logic and power converter noise from buck converter 19 that is coupled into the analog circuits or conducted on the analog power supply, causing error in the sampled values.

Immediately prior to time $T_{PRE}$, value offset value is written to latch 24 by processor core 14, and digital clock signal dclk is halted. Signal sync_pr is then asserted at the next occurrence of ADC sync signal adc_sync, loading value offset value into divider chain 23. Divider chain 23 resumes operation, generating digital clock signal dclk, which now has edges displaced from the critical edges of sampling clock phase signals Φ1, Φ2. Power supply blocking signal ps_block, which extends around the critical edges of sampling clock phase signals Φ1, Φ2 for a sufficient period of time that power supply generated transient signals have settled, qualifies the master clock signal master clk to generate the ps_switch signal. The ps_switch signal operates buck converter 19 only when ps_block is not asserted. While the width of power supply block signal ps_block is shown as only two periods of master clock signal master clk, it is understood that power supply block signal ps_block will extend for as many cycles as necessary for the power supply output to stabilize after switching and any coupled transient energy has sufficiently diminished.

Figure 6:
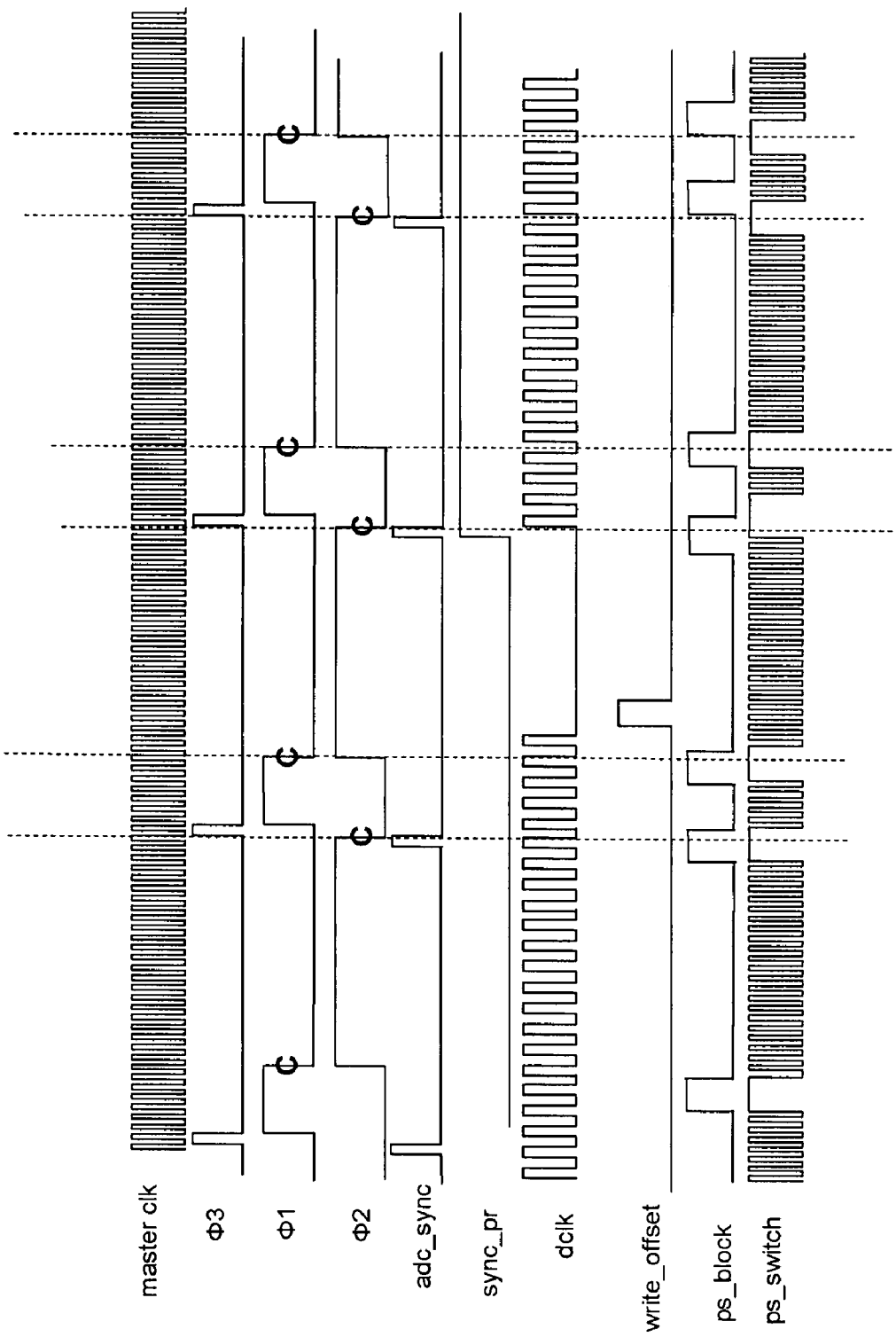
FIG. 6 is another signal timing diagram depicting signal relationships within the circuit of FIG. 1.

Referring now to FIG. 6, the signal timing of FIG. 5 is expanded to show the proper scale of the signals with respect to the master clock and the relatively short interruptions of the ps_switch signal during the assertion of ps_block. In the exemplary embodiment of FIG. 6, the duration of clock phase signal Φ3 is one cycle of master clock signal master_clk. The duration of clock phase signal Φ1 is seven cycles of master clock signal master_clk, and the direction of clock phase signal Φ2 is twenty-four cycles of master clock signal master_clk.

While the invention has been particularly shown and described with reference to the preferred embodiments thereof, it will be understood by those skilled in the art that the foregoing and other changes in form and details may be made therein without departing from the spirit and scope of the invention. Therefore, the present invention is understood to contemplate such variation from the disclosed embodiment.

What is claimed:

1. An integrated circuit, comprising:
    an analog-to-digital converter for receiving an analog input signal and providing a digital output, wherein a discrete-time sampling circuit of the analog-to-digital converter is responsive to a first clock signal to sample the analog input signal;
    a digital logic circuit for performing processing operations within the integrated circuit, wherein the digital logic circuit is responsive to a second clock signal to cause transitions of logic within the digital logic circuit; and
    a clock generator circuit for receiving a master clock signal and providing the first clock signal and the second clock signal as frequency divisions of the master clock signal, wherein the clock generator circuit includes a first clock divider for generating the first clock signal from the master clock signal and a second clock divider for generating the second clock signal from the master clock signal, and wherein the clock generator circuit adjusts an edge relationship between the first clock signal and the second clock signal such that transitions of the second clock signal do not occur near critical sampling edges of the first clock signal by presetting the first clock divider or the second clock divider with an offset value, whereby sampling error in the analog-to-digital converter due to transition noise coupled from the digital logic circuit is substantially eliminated.

2. The integrated circuit of claim 1, wherein the digital logic circuit comprises a processor core, and wherein the processor core is coupled to a memory having program instructions for execution by the processor core, wherein the program instructions include program instructions for presetting the first clock divider or the second clock divider with an offset value.

3. The integrated circuit of claim 2, wherein the program instructions for presetting preset the second clock divider, and wherein the clock generator circuit generates a synchronization signal in conformity with an output of the first clock divider, and wherein the program instructions for presetting are executed in response to the synchronization signal.

4. The integrated circuit of claim 3, wherein the program instructions for presetting are further executed in response to initialization of the analog-to-digital converter, whereby subsequent assertions of the synchronization signal do not trigger the presetting.

5. The integrated circuit of claim 1, wherein the clock generator is further responsive to a halting signal, wherein the clock generator stops generating the second clock signal in response to the halting signal and presets the second clock divider while the second clock signal is not being generated.

6. The integrated circuit of claim 5, wherein the halting signal is a power down signal for stopping operation of the digital logic circuit.

7. The integrated circuit of claim 5, wherein the digital logic circuit comprises a processor core, and wherein the processor core is coupled to a memory having program instructions for execution by the processor core, wherein the program instructions include program instructions for presetting the second clock divider with an offset value, wherein the clock generator stores the offset value in a latch, halts the second clock divider in response to a halting signal, thereby stopping execution within the processor core, and loads the offset value into the second clock divider in response to a synchronization signal generated in conformity with an output of the first clock divider, and wherein the second clock divider is subsequently restarted at the offset value.

8. The integrated circuit of claim 1, wherein the clock generator comprises control logic for receiving an offset value, wherein the clock generator stores the offset value in a latch, halts the second clock divider in response to a halting signal, thereby stopping operation of the digital logic circuit, and loads the offset value into the second clock divider in response to a synchronization signal generated in conformity with an output of the first clock divider, and wherein the second clock divider is subsequently restarted at the offset value.

9. The integrated circuit of claim 1, wherein the presetting is performed in response to initialization of the analog-to-digital converter.

10. The integrated circuit of claim 1, further comprising a power converter operated by a clock having edges aligned with the second clock signal, whereby sampling error in the analog-to-digital converter due to power converter noise coupled from the power converter is substantially eliminated.

11. The integrated circuit of claim 1, further comprising a power converter operated by a switching clock signal, wherein the clock generator prevents switching of the power converter in a predetermined window around the critical sampling edges, whereby sampling error in the analog-to-digital converter due to power converter noise coupled from the power converter is substantially eliminated.

12. A method of reducing noise in an integrated circuit having a discrete time sampling analog-to-digital converter and digital logic circuit, comprising:
    generating a first clock signal and a second clock signal from a master clock signal;
    clocking a discrete time sampling circuit of the analog-to-digital converter with the first clock signal;
    clocking the digital logic circuit with the second clock signal; and
    adjusting an edge relationship between the second clock signal and the first clock signal by setting an offset of a divider that generates the second clock signal, such that transitions of the second clock signal do not occur near critical sampling edges of the first clock signal, whereby sampling error in the analog-to-digital converter due to transition noise coupled from the digital logic circuit is substantially eliminated.

13. The method of claim 12, wherein the digital logic circuit comprises a processor executing program instructions that perform the adjusting by setting the offset in response to a synchronization signal derived from the first clock signal.

14. The method of claim 12, further comprising halting the generation of the second clock signal during the adjusting.

15. The method of claim 12, wherein the adjusting further adjusts edges of switching signals of a power converter, whereby sampling error in the analog-to-digital converter due to power converter noise coupled from the power converter is substantially eliminated.

16. An analog-to-digital converter integrated circuit including a digital processing circuit, an analog sampling circuit, and a clock generator for generating digital clock signals for the digital processing circuit and sampling clock signals to the analog sampling circuit, wherein the clock generator circuit adjusts a delay of the digital clock signals by programming an offset of a divider within the clock generator that generates the digital clock signals such that edges of the digital clock signal are away from critical sampling edges of the sampling clock signals.

17. The analog-to-digital converter integrated circuit of claim 16, further comprising a memory for storing program instructions for execution by the digital processing circuit, and wherein the program instructions include program instructions for setting an offset value within the clock generator, and initiating an operation by the clock generator that halts the digital clock signals, loads the offset value into a clock generator divider circuit and restarts the digital clock signals.

18. The analog-to-digital converter integrated circuit of claim 16, further comprising a power converter operated by a switching clock signal, wherein the clock generator further prevents switching of the power converter in a predetermined window around the critical sampling edges, whereby sampling error in the analog-to-digital converter due to power converter noise coupled from the power converter is substantially eliminated.

* * * * *